United States Patent
Carroll et al.

(10) Patent No.: US 9,031,826 B2
(45) Date of Patent: May 12, 2015

(54) METHOD AND APPARATUS FOR SIMULATING OPERATION IN A DATA PROCESSING SYSTEM

(75) Inventors: Matthew James Carroll, Toronto (CA); Christian Marcelo Garcia-Arellano, Richmond Hill (CA); Sam Sampson Lightstone, Toronto (CA); Bruce Gilbert Lindsay, San Jose, CA (US); Adam J. Storm, Toronto (CA); Daniel Costante Zilio, Georgetown (CA); Adriana Zubiri, Richmond Hill (CA)

(73) Assignee: International Business Machines Corporation, Armonk, NY (US)

( * ) Notice: Subject to any disclaimer, the term of this patent is extended or adjusted under 35 U.S.C. 154(b) by 1932 days.

(21) Appl. No.: 11/278,124

(22) Filed: Mar. 30, 2006

(65) Prior Publication Data

US 2007/0233439 A1    Oct. 4, 2007

(51) Int. Cl.
*G06F 7/60* (2006.01)
*G06F 13/12* (2006.01)
*G06F 13/10* (2006.01)
*G06F 9/44* (2006.01)
*G06F 17/50* (2006.01)

(52) U.S. Cl.
CPC .................................. *G06F 17/5022* (2013.01)

(58) Field of Classification Search
CPC ............. G06F 7/60; G06F 9/44; G06F 13/10; G06F 13/12
USPC ....................................................... 703/2, 21
See application file for complete search history.

(56) References Cited

U.S. PATENT DOCUMENTS

| | | | | |
|---|---|---|---|---|
| 5,802,357 A * | 9/1998 | Li et al. | .............................. | 1/1 |
| 5,809,282 A * | 9/1998 | Cooper et al. | ................ | 709/226 |
| 5,983,215 A * | 11/1999 | Ross et al. | ..................... | 707/714 |
| 6,263,331 B1 * | 7/2001 | Liu et al. | .............................. | 1/1 |
| 6,973,622 B1 * | 12/2005 | Rappaport et al. | ............ | 715/735 |
| 7,085,769 B1 * | 8/2006 | Luo et al. | .............................. | 1/1 |
| 7,274,670 B2 * | 9/2007 | Hicks et al. | ................... | 370/252 |
| 7,409,517 B2 * | 8/2008 | Dageville et al. | ............. | 711/170 |
| 7,539,608 B1 * | 5/2009 | Dageville et al. | ............... | 703/21 |
| 7,698,111 B2 * | 4/2010 | Abrahao et al. | .................. | 703/2 |

(Continued)

OTHER PUBLICATIONS

Amit Shukla et al., "Storage Estimation for Multidimensional Aggregates in the Presence of Hierarchies", 1996, Proceedings of the VLDB Conference, pp. 522-531.*

(Continued)

*Primary Examiner* — Aniss Chad
*Assistant Examiner* — Juan Ochoa
(74) *Attorney, Agent, or Firm* — Janaki K. Davda; Konrad, Raynes, Davda & Victor LLP

(57) ABSTRACT

Methods and systems are provided for executing a simulation of an operation in a data processing system. In one implementation, the method includes executing an operation under a first set of conditions, determining a characteristic associated with the execution of the operation under the first set of conditions, and executing a simulation of the operation under a second set of conditions different from the first set of conditions. The simulation of the operation is constrained by the determined characteristic. The method can further include determining a cost/benefit of executing the operation under a set of conditions different from the first set of conditions based at least in part on the simulation.

19 Claims, 8 Drawing Sheets

(56) References Cited

U.S. PATENT DOCUMENTS

2006/0224531 A1* 10/2006 Abrahao et al. ............... 706/15
2007/0217676 A1* 9/2007 Grauman et al. ............ 382/170

OTHER PUBLICATIONS

Arnd Christian Konig et al., "Combining Histograms and Parametric Curve Fitting for Feedback-Driven Query Result-Size Estimation", 1999, Proceedings of the 25th VLDB Conference, pp. 423-434.*
Thomas p. Nadeau et al., "A Pareto Model for OLAP View Size Estimation", published by IBM Press in 2001, IBM Proceedings of the 2001 Conference of the Centre for Advanced Studies on Collaborative Research, pp. 1-13.*
Thomas p. Nadeau et al., "Binominal Multifractal Curve Fitting for View Size Estimation in OLAP," SCI 2001 Proceedings, vol. II, Information Systems, pp. 194-199.*
Li et al., Greedy Dual-Join Locality-Aware Buffer Management for Approximate Join Processing Over Data Streams, Jul. 1, 2004, CAS: Computer Science: Technical Reports, pp. 1-21.*
Deterministic algorithm, Wikipedia, printed Mar. 18, 2014, pp. 1-5.*
Determinism, Wikipedia, printed Mar. 18, 2014, pp. 1.*
Yu and Cornell, Buffer Management Based on Return on Consumption in a Multi-Query Environment, Jan. 1993, The VLDB Journal, pp. 1-37.*
Nag, B., et al., "Memory Allocation Strategies for Complex Decision Support Queries", Proceedings of the Seventh International Conference on Information and Knowledge Management, 1998, 8 pp.

* cited by examiner

METHOD AND APPARATUS FOR SIMULATING OPERATION IN A DATA PROCESSING SYSTEM

FIELD OF THE INVENTION

The present invention relates generally to simulation systems, and more particularly to methods to more accurately simulate operation of a real system to determine a cost/benefit associated with executing an operation in the real system.

BACKGROUND OF THE INVENTION

Computer system users, administrators, and designers (referred to herein as users) usually have a goal of highest performance at lowest cost. To achieve this goal, users typically implement a simulation to model operation of a real system to determine a cost/benefit associated with changing an operating condition associated with the real system. Conventional simulation systems (or virtual systems), however, are generally limited in that certain operating parameters associated with real systems that the simulation systems need in order to appropriately mimic operation of the real systems are unknown. For example, in a database system, the final size of a sort is only known with complete certainty only after the sort is executed. Consequently, for these unknown operating parameters, conventional simulation systems typically predict such unknown operating parameters and constrain operation of the simulation system using such predicted operating parameters (e.g., a predicted sort size in the example above). Simulating a real system based on predicted operating parameters can lead to substantially inaccurate results and, therefore, inaccurate cost/benefit analyses.

Accordingly, what is needed are techniques to more accurately simulate operation of a real system so that, for example, a more reliable cost/benefit analysis can be obtained. The present invention addresses such a need.

BRIEF SUMMARY OF THE INVENTION

In general, in one aspect, this specification describes a method for simulating an operation. The method includes executing an operation under a first set of conditions, determining a characteristic associated with the execution of the operation under the first set of conditions, and executing a simulation of the operation under a second set of conditions different from the first set of conditions. The simulation of the operation is constrained by the determined characteristic.

Particular implementations can include one or more of the following features. The method can further include determining a cost/benefit of executing the operation under a set of conditions different from the first set of conditions based at least in part on the simulation. The cost/benefit can represent the amount of time saved or lost due to executing the operation with the set of conditions different from the first set of conditions. Executing an operation can include executing a sort operation or executing a hash join operation. Executing a sort operation can include executing a bin sort or a tree sort. The first set of conditions can comprise a first pre-determined size of memory and the second set of conditions can comprise a second pre-determined size of memory that is different from the first pre-determined size of memory. Determining a characteristic associated with the execution of the operation can include determining one or more of a processor (CPU) cost or an input/output (I/O) cost associated with the execution of the operation under the first set of conditions. The determined characteristic can be unknown prior to the execution of the operation under the first set of conditions.

In general, in another aspect, this specification describes a computer program product, tangibly stored on a computer-readable medium, for simulating an operation. The product comprises instructions to cause a programmable processor to execute an operation under a first set of conditions, determine a characteristic associated with the execution of the operation under the first set of conditions, and execute a simulation of the operation under a second set of conditions different from the first set of conditions. The simulation of the operation is constrained by the determined characteristic.

In general, in another aspect, this specification describes a data processing system including a real system operable to execute an operation under a first set of conditions, and a virtual system operable to determine a characteristic associated with the execution of the operation under the first set of conditions within the real system. The virtual system is further operable to execute a simulation of the operation under a second set of conditions different from the first set of conditions, in which the simulation of the operation in the virtual system is constrained by the determined characteristic.

The details of one or more implementations are set forth in the accompanying drawings and the description below. Other features and advantages will be apparent from the description and drawings, and from the claims.

BRIEF DESCRIPTION OF SEVERAL VIEWS OF THE DRAWINGS

Like reference symbols in the various drawings indicate like elements.

DETAILED DESCRIPTION OF THE INVENTION

Implementations of the present invention relates generally to simulation systems, and more particularly to methods to more accurately simulate operation of a real system to determine a cost/benefit associated with executing an operation in the real system. The following description is presented to enable one of ordinary skill in the art to make and use the invention and is provided in the context of a patent application and its requirements. Various modifications to implementations and the generic principles and features described herein will be readily apparent to those skilled in the art. Thus, the present invention is not intended to be limited to the implementations shown but is to be accorded the widest scope consistent with the principles and features described herein.

Figure 1:
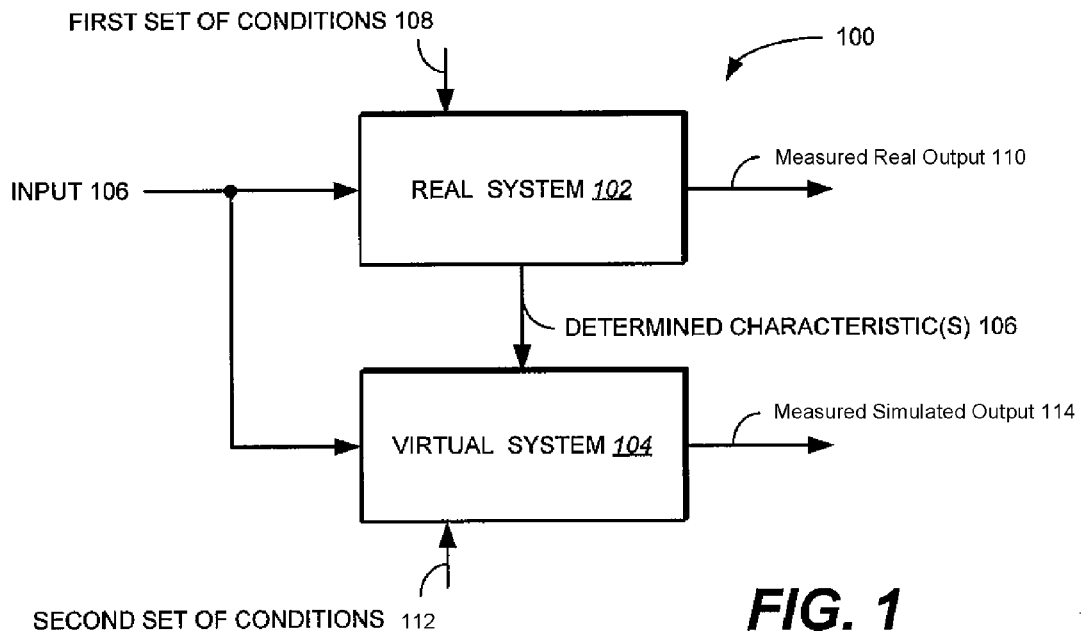
FIG. 1 is a block diagram of a data processing system including a real system and a virtual system in accordance with one implementation of the invention.

FIG. 1 illustrates a data processing system 100 in accordance with one implementation of the invention. Data processing system 100 can be any number and type of system including, for example, a workstation, a desktop computer, a laptop computer, a personal digital assistant (PDA), a cell phone, a network, and so on. In one implementation, data processing system 100 includes a real system 102 and a virtual system 104.

In general, real system 102 is operable to execute an operation based on one or more inputs 106 under a first set of conditions 108 and generate a measured real output 110, and virtual system 104 is operable to execute a simulation of the operation (using the same input(s) 106) under a second set of conditions 112 (that are different from the first set of conditions) and generate a corresponding measured simulated output 114. In one implementation, the execution of the operation in real system 102 occurs simultaneously as the execution of the simulation of the operation in virtual system 104. The operations that can be executed by real system 102 (and simulated in virtual system 104) can be any type of operation desired to be simulated by a user. For example, with respect to database systems, the operation can include a sort, hash join, or the like, as discussed in greater detail below. In one implementation, virtual system simulates the exact same operation performed by real system 102 using (or constrained by) one or more determined characteristics measured form the operation performed by real system 102. The one or more determined characteristics are typically unknown prior to the performance of the operation in real system 102. Thus, unlike a conventional simulation system that may estimate unknown operating parameters (associated with a real system) that are required to execute a simulation, virtual system 104 receive such operating parameter (determined characteristics) from real system 102 without having to predict such operating parameters.

Figure 2:
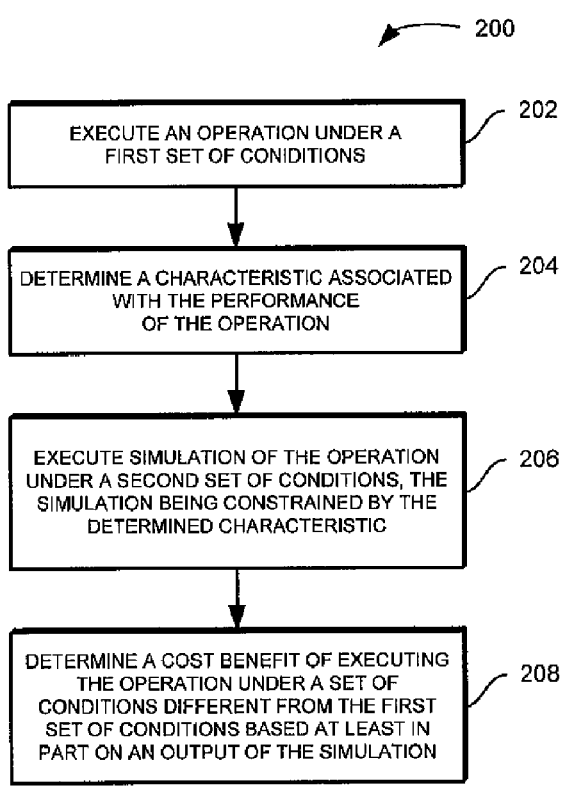
FIG. 2 illustrates a method for determining a cost/benefit of an operation in the data processing system of FIG. 1 in accordance with one implementation of the invention.

FIG. 2 illustrates a method 200 for determining a cost/benefit associated with executing an operation within a data processing system (e.g., data processing system 100) in accordance with one implementation of the invention. An operation is executed (e.g., by real system 102) under a first set of conditions (step 202). The operation can be any type of operation that can be simulated by a simulator. The first set of conditions can be automatically determined by the real system, or be based at least in part on user input. In one implementation, the first set of conditions represents those conditions for which a cost/benefit is being determined. For example, the first set of conditions can represent a predetermined amount of memory allocated to the real system to execute the operation. Thus, in this example, a cost/benefit associated with executing the operation using a different memory allocation can be determined.

One or more characteristics associated with the execution of the operation in the real system are determined (step 204). In one implementation, the determined characteristic(s) are unknown prior to the execution of the operation by the real system. For example, in one implementation, a determined characteristic represents the processor (CPU) time required to execute the operation in the real system, as discussed in greater detail below. The simulation of the operation is executed (e.g., by virtual system 104) under a second set of conditions (step 206). The simulation is constrained by the one or more determined characteristics. Thus, in the example above, the simulation would be executed such that the simulation is executed in accordance with the same CPU time as in the real system. Thus, in one implementation, the only variable conditions are the second set of conditions. A cost/benefit of executing the operation under a set of conditions different from the first set of conditions is determined (e.g., by a tuner system (not shown)) based at least in part on an output of the simulation (step 208). Accordingly, because the simulation can be executed in accordance with one or more determined characteristics from the real system, a more accurate cost/benefit analysis can be determined based on the simulation.

Determining Cost/Benefit of a Sort in a Database System

One particular implementation of a virtual system will now be described with respect to simulating a sort in a database system. In particular, techniques to measure the estimated cost of a sort for a given amount of memory will now be described. The estimated cost is based on the measurement of the cost to execute (or simulate) the same sort under a different amount of memory (in a virtual system) using the complete information of the characteristics of the sort (e.g., the sort size) as determined by the sort executed in the real system. The cost computed using this method can allow a user to compute the marginal benefit of allocating additional memory to sort in a database engine, which in turn can be used to decide if it is beneficial to trade memory with other memory consumers in the database engine that are not of the sort kind. Other memory consumers in a database engine include, for example, a buffer pool (page cache), a query cache, and the like.

In a database system, the final size of a sort is only known with complete certainty after the sort is executed. The reason for this is that it is very hard to predict the size of the data to be sorted due to the data being the product of other subqueries, and the size of the input for those subqueries is also hard to predict. It is also hard to predict the size of the input if the data is being received directly from disk because the continuous updates to corresponding tables make it very difficult to maintain current statistics that measure such input size. The same argument can be made for the prediction of the processor (CPU) time involved in the execution of the sort, and also the input/output (I/O) time involved in the execution of the sort. Both of these characteristics depend on the amount of data to be sorted, the characteristics of the data, the characteristics of the processor (CPU) in which they are executed, and the characteristics of the storage system in which the data is written to and read from (for I/O time). For these reasons, in one implementation, a virtual system will use actual CPU cost and I/O cost during a simulation of a sort, in which the actual CPU cost and I/O cost will be measured during execution of the sort in a real system. In this implementation, complete information about the characteristics of the sort, like for example its size, will be used by the virtual system because sort size can also be measured during the execution of the sort in the real system. The computation of the estimated cost/benefit will be based on this complete information.

In one implementation, the only variable between the sort executed in the real system and the simulated sort executed in the virtual system is the amount of memory granted to the sort. In one implementation, a cost predictor will assume that the simulated sort will have been granted a different amount of memory than the amount granted to the real measured sort. This will allow the cost predictor to compute the difference in cost between the real measured sort and the simulated sort, and will also allow the cost predictor to compute the difference in the amounts of memory granted to the real measured sort and the simulated sort. These two differences can be used to compute the marginal cost/benefit (e.g., in seconds per page of memory) of giving the sort more or less memory. This marginal cost/benefit for sort can be compared with that of other memory consumers to decide whether to allocate more memory to the sort or take memory from the sort. Methods to compute the marginal cost/benefit and to tune the memory allocation for all memory consumers are described in greater detail below.

In one implementation, a sort is executed in two phases. In the first phase, an algorithm for sorting the data in-memory is used. In the second phase, an algorithm for performing an external sort is used, that is, all the data is in external storage. The second phase is necessary if the amount of memory provided for the first phase was not enough to fit all the data to be sorted. In this case, the first phase will produce a group of subsets of the input data, each of the subsets in sorted order, which will be written to an external storage (disk). Each of these subsets is called a run.

The basic assumption is that the performance of a sort is deterministic. Given the amount of memory that a sort can use during the first phase and the characteristics of the sort, it can be predicted the number of runs that will be generated (if any). Given the number of runs generated by the first phase and the amount of memory to use in the second phase, it can be predicted the number of second-phase operations that will be required to obtain the sorted result. Accordingly, in one implementation, provided below is a method to simulate the number of basic sorting operations performed by the system to sort the data in each of the two phases for any amount of memory. In one implementation, determined characteristics (associated with a sort performed in a real system) includes the actual performance of the basic operations in the real execution of the sort (i.e., processor (CPU) time to perform the sort), in addition other known parameters include the amount of memory used in the real system and the amount of memory used in the virtual system.

Figure 3:
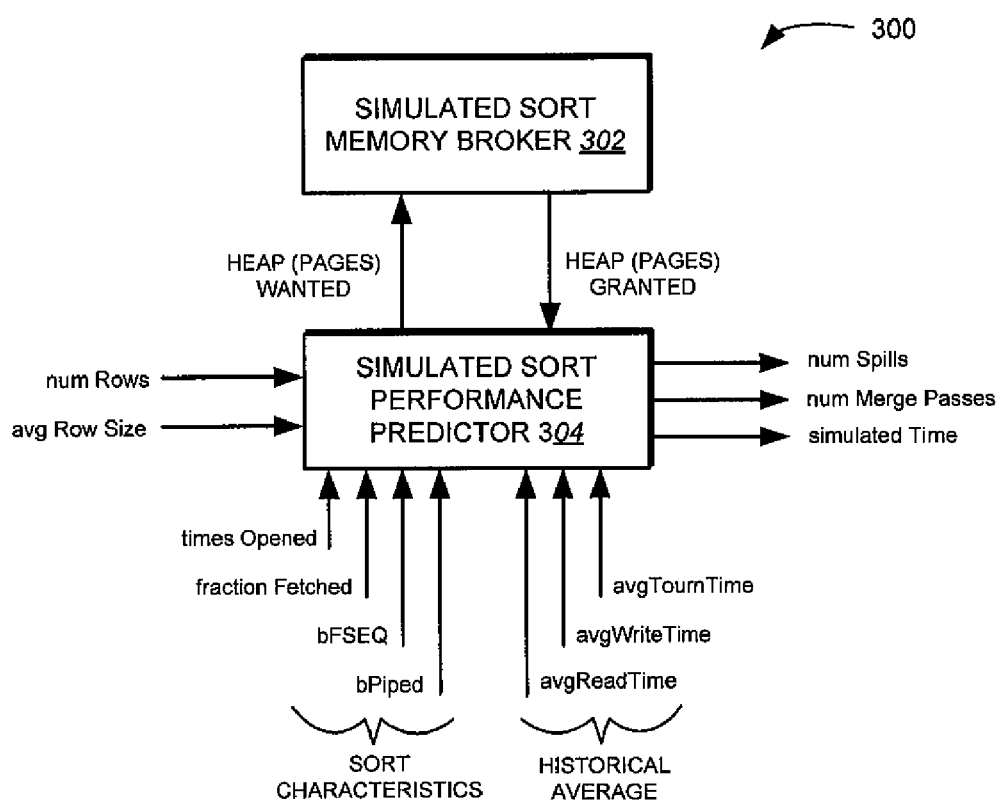
FIG. 3 is a block diagram of a virtual system in accordance with one implementation of the invention.

In one implementation, the cost of the virtual system is predicted by multiplying the predicted number of basic operations by the average time each of these basic operations took in the real system. In general, the performance of a sort depends on various variables. One of the most important variables includes the amount of memory assigned to the sort. This invention describes a method for accurately estimating the cost of a sort using the cost measured during the execution of a sort with the same characteristics that is using a different amount of memory. In one implementation, the cost represents the amount of time saved (or lost) due to performing the sort with a different amount (or allocation) of memory. FIG. 3 shows a block diagram of a virtual system 300 operable to simulate a sort in accordance with one implementation of the invention. Virtual system 300 includes a simulated sort memory broker 302 and a simulated sort performance predictor 304 (or cost predictor), the operations of which are described in greater detail below.

Introduction to the Sort Algorithm Implementation

In one implementation, the sort algorithm has two main phases—an insert phase and a fetch phase. Another phase (referred to herein as the open phase) is in between the insert phase and the fetch phase. In one implementation, the open phase is used to identify the transition point between the insert phase and the fetch phase, and to prepare data for the fetch phase. The actual sorting of the rows can occur at several points during the life of a sort depending on the amount of memory (e.g., pages or heap) that the sort receives from the sort memory broker and the amount of data to be sorted. The trivial case is that the sort buffer is larger than the data, in which case, the actual sorting of the rows is done when the sort is opened, for example, using a high-performance in-memory sort algorithm, like bin sort (radix sort) or tree sort (balanced binary tree sort), as discussed in greater detail below. In one implementation, an optimizer determines which algorithm is used, and the user can disable bin sort by setting a registry variable.

When the size of the sort buffer is not enough to hold all the data, in one implementation, the algorithm splits the data into runs, each of which are sorted using the same high-performance in-memory sort algorithms and then spilled to a temporary table. In one implementation, the temporary table passes through a buffer pool before being written to the temporary tablespace on disk. Accordingly, if the buffer pool is large enough to contain the temporary table then no data will be written to disk. Once this sort is opened, the runs are merged using a tournament merge algorithm, holding in memory one row per run at a time. When the amount of memory available for merging is not enough to do the entire merge in one pass of this tournament merge sort, the algorithm needs to do more than one pass, having to write and read to temporary table all the data more than one time. The size of the buffer pool associated to the temporary table space also affects the performance of the merge phase when all or part of the temporary table was written to disk, because if the buffer pool is not large enough for pre-fetching data for all the runs, then the merge width of each merge pass must be reduced until a two-page pre-fetching per run can be done, thus increasing the number of merge passes.

Other elements that can affect the performance of a sort are the piped flag (bPiped), the limited size sort, the "runs-in-sequence" optimization, SMP, and vector aggregation.

piped/non-piped: When the sort is marked as non-piped it means that the sorted table will be fetched more than one time. For this reason, sort chooses to write all the sorted data to a temporary table to be able to fetch from the temporary table several times.

limited size sort: This parameter indicates that there is a pre-defined number of rows that will be fetched from this sort. That is, the consumer is only interested in the top portion of the data to be sorted. Sort will always use tree sort in this case, and the memory requirements for this sort are determined on the memory required to hold the rows to be fetched.

runs-in-sequence: This optimization indicates that the spilled runs are in sequence, in general because the input data was already in the order required. No merging takes place in this case, the rows are fetched directly from the runs.

SMP: This affects the performance because the data will be sorted in parallel by several agents, for which several buffers are required to sort the data. In SMP, if none of the buffers were spilled and the sort is piped, an in-memory tournament merge is done, so no data is written to temporary table.

vector aggregation: This affects the performance because the vector records are also inserted in the buffers, in addition to the data records, and the space for these records needs to be taken into account.

Model for Predicting the Performance of a Sort

In general, the performance of a sort mainly depends on the amount of memory (pages or heap) granted to the sort. In one implementation, this amount of memory is decided by a sort memory broker (e.g., simulated sort memory broker 302 of FIG. 3). In one implementation, the cost predictor (or simulated sort performance predictor 304 of FIG. 3) takes as input the amount of memory available to the sort for which the cost has to be estimated, and the measured cost of the same sort when executed with a different amount of memory. The cost predictor produces an estimate of the cost of the sort under the alternative amount of memory. In addition, both the I/O and CPU components can affect the performance of a sort, each of which being more or less important depending on whether the workload is mostly CPU bound or mostly I/O bound.

For the CPU component, there are two elements that determine its cost. The first cost is the algorithm used to sort an in-memory buffer. The second is the number of merge tournament comparisons (only if a second-phase is required). For the I/O component, the element that determines its cost is the number of times that the data has to be written and read back from external storage (e.g., buffer pool associated to a temporary table space). For both CPU and I/O components, the cost model needs as input the measured time consumed by the real sort when performing the I/O operations and CPU sections. The cost model also needs as input the number of those operations performed by the real sort. Then, the algorithm predicts the number of each of these operations the simulated sort performs based on the memory assigned to the simulated sort. Assuming that a unit of each of the basic operations will take the same amount of time in the real sort and in the simulated sort, obtaining an estimate of the time consumed by the simulated sort can be determined based on the equation below:

EstimatedTime=((MeasuredTime/numOperationsReal)*numOperationsSimulated).

A method for predicting the number of operations for the simulated sort for both the I/O component and the CPU component will now be discussed.

In addition to the amount of memory available to the simulated sort performance predictor 304, the following are the input parameters for the simulated sort performance predictor 304—sort size, sort characteristics, and basic operation times. Sort size values can be obtained with precision (from a real system) after the first open of the sort—e.g., the number of rows (numRows) and the size of the sort (e.g.) in bytes (avg Row Size). Sort characteristics represent information that is available when the sort is opened and when the sort is closed, in one implementation, such sort characteristics include, the number of times the sort was opened (timesOpened), the fraction of the inserted rows that were fetched (fraction Fetched), a flag indicating whether the runs were generated in order (no merge required) (bFSEQ), and a flag indicating whether the sort is piped or non-piped (bPiped). In one implementation, basic operations time represents the time measured to perform the four following basic sort operations— the total read time (I/O), the total write time (I/O), the total time to perform a merge comparison step (CPU), and the BIN SORT time (CPU).

CPU Time

Time Spent Performing Sort of an In-Memory Buffer

In one implementation, the two high-performance in-memory sort algorithms implemented are: BIN SORT and TREE SORT. For BIN SORT we will consider the CPU component of both the buffer sort phase and the tournament merge phase. For TREE SORT, the only case where we need to consider CPU time is the size limited sort case. Details of these two algorithms are provided below.

Tree Sort

For the TREE SORT algorithm, in one implementation, the number of comparisons per row is dictated by the height of the balanced binary tree, which will be at most log N, for which the total number of comparisons for sorting all the rows will be in the order of N*log N. Accordingly, this gives the total number of comparisons required to sort N amount of rows broken up into R (evenly-distributed) runs as follows (using big O notation):

$$O(R*(N/R*\log(N/R)))=O(N*(\log N - \log R))$$

so the more blocks of data there are, the less sorting work needs to be done during the buffer sort phase, although more merging will have to later be performed to produce a complete sorted output. At the end, the CPU component of both the buffer sort phase and tournament merge phase will be the same regardless of how the work is distributed between the buffer sort and tournament merge passes. The main reason for this is that the cost to compare two rows (i.e., the cost that dominates the sorting) is substantially the same for both phases, because both use the same comparison functions. The following equation shows the complexity of both the tree buffer sort phase, where the R sorted runs are generated, and the tournament merge phase, where the R sorted runs are merged:

$$O(\text{buffer sort phase+tournament merge phase})=O(N* (\log N-\log R)+N*\log R)=O(N*\log N)$$

For this reason, in the general TREE SORT case, there is no difference in the CPU cost if the amount of memory that is used is changed during the buffer sort phase. However, in the size limited sort (or truncated sort), the CPU component of the first phase needs to be considered, because for size limited sorts (where the maximum number of rows wanted is M), the complexity when everything is sorted in one run is as follows:

$$O(N*\log M)$$

but when there is not enough memory to hold a tree for M rows, we have to spill the N rows, generating R sorted runs, and then merge them. For this case, the complexity is as follows:

$$O(N*(\log N-\log R)+M \log R)=O(N*\log N+(M-1)*\log R)$$

The same situation can happen when the sort has spilled and not all the rows of the sort are fetched. For these two described cases, the smallest CPU time is obtained when the sort generates the largest number of small runs, but small enough to make the sort do just one merge pass. This can happen if the cursor that is fetching rows from the sort is closed, and more commonly, in the merge join operator.

Bin Sort

The BIN SORT counting algorithm (also known as radix/distribution sort) is a linear-time algorithm (O(b*N), where b is the number of bits in the key, and N is the amount of data to sort. The initial assumption for this algorithm was that the CPU time was not going to be affected by memory use. In other words, the assumption was that it would take just as long to sort the same 10000 rows of data, whether sorted in 10 runs of 1000, or 2 runs of 5000, or all at once. However, in one implementation, experimental evidence showed that the actual performance of this algorithm degrades logarithmically when increasing the number of rows to be sorted. This seems to be related to the number of duplicates in the data, and the number of levels of the key that need to be processed to break any ties.

As expected, from the same experimental evidence, the cost to "bin sort" a row in the buffer sort phase is much smaller that the cost to sort a row in the tournament merge phase. For this reason, if all the rows are fetched from the sort (normal case), then the more work that is done in the buffer sort phase results in the best performance, and to do more work in the buffer sort phase as much memory as possible is needed for the sort buffer. However, in the case where not all the rows are fetched, the issue is more complex and giving as much memory as possible to the sort may not be the right solution to get the best performance possible. This situation that not all the rows are fetched can happen in two scenarios: 1) merge join, for which two sorts are created, where one of them may not be completely fetched; or 2) the user closes a cursor before all the rows are fetched. Note that this second case could be replaced for a fetch first K rows if the user knew the maximum K in advance, but this type of scenario is driven by a user and not by a database engine.

In general, the cost of spilling to disk will dominate the total sorting time regardless of the number of rows fetched, so the first strategy should be to avoid spilling to disk at all costs. However, there are two cases when this strategy may not be the best strategy to get the best performance, for example, in the two following cases: 1) when the spill cannot be avoided because the sortheap value, which is a configuration parameter for the database engine that controls the maximum amount of memory that the query operator (e.g., sort, hash join, and so on) can be granted by the memory broker, is smaller than the total amount of memory needed to sort all the rows in just one buffer, or 2) when there is enough memory in the buffer pool to hold the whole temporary table and avoid spilling to disk, in which case the cost of spilling a row will be very small, and comparable to the sort of bin sorting a row.

Figure 4:
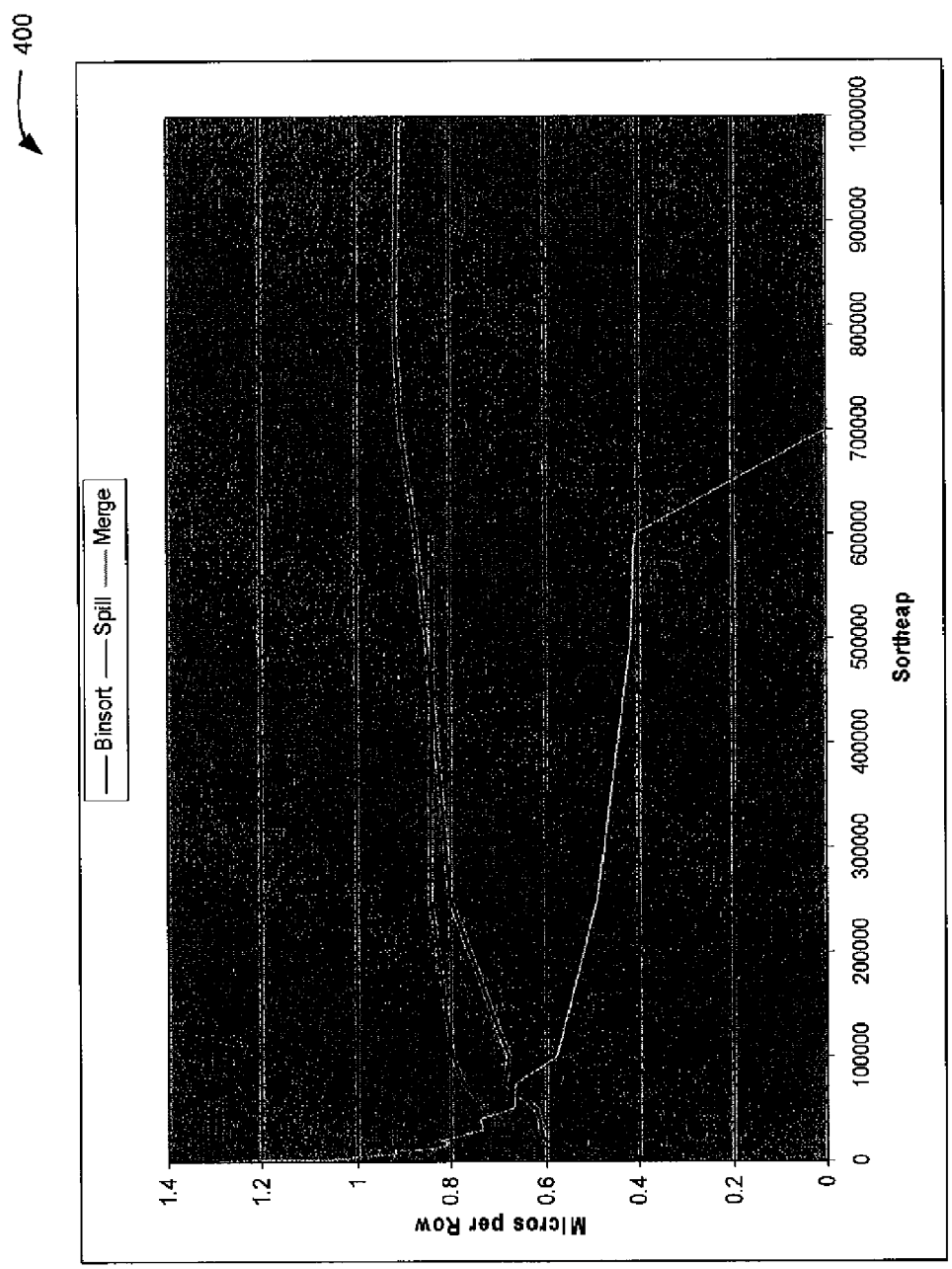
FIG. 4 is a graph of processor (CPU) cost associated with a BIN SORT operation.

In these two cases the CPU component of the sort algorithm becomes more significant for the performance of the whole sort operation. To illustrate this situation, Table 1 below contains the cost of each of the operations for a sort sorting 30 million rows that lies in the second case, that is, the spills will go to the buffer pool but not to disk. As shown by Table 1, the larger the sortheap, the smaller the cost to merge a row becomes, and the larger the cost it will entail to bin sort a row. Also, the cost to spill a row to this large buffer pool is comparable to the cost to bin sort a row in most cases. At sortheap=600K pages, the spill is avoided and that is the reason for the drop to 0 in the spill and merge time, as shown in diagram 400 of FIG. 4.

TABLE 1

| Operation | Min | Max (micros per row) |
|---|---|---|
| Binsort a Row | Logarithmic | 0.30 | 0.90 |
| Spill a Row | Logarithmic | 0.31 | 0.84 |
| Merge a Row | 1/logarithmic | 0.40 | 1.29 |

In this case, the sort being used to illustrate the situation is such that, if less that 20% of the rows are going to be fetched, then the optimal amount of memory to give the sort is the minimum such that two merge passes are avoided. If more than 20% of the rows are going to be fetched, then most of the work should be done in the buffer sort phase, that is, the sort buffer should be given as much memory as possible.

The example above shows the significance of the CPU cost of BIN SORT, and why the CPU cost should be included in the simulation model (e.g., as part of the simulation of the sort by a virtual system). In one implementation, the logarithmic model is implemented due to reasonably good accuracy and simpler calculations.

The number of comparisons in the sort buffer phase can be obtained in the same way as defined for TREE SORT, but in the case of BIN SORT the measured cost per row will be much smaller, as follows:

# of comparisons in sort phase=$N*\log(N/R)$ where N/R is the number of rows per run, that is, the height of the "tree"

Time Spent Performing Merge Tournament Comparisons

The amount of memory that is available for the merge will dictate the maximum width of a merge tournament tree, and from that maximum width we can determine the number of merge passes and the number of runs that will be generated in each merge pass (if any). In one implementation, the time to perform a single merge pass is assumed to be proportional to the log of the merge width, as follows:

comparisons in a single merge pass=$N*\log(\text{merge\_width})$

Thus, in one implementation, the total merge time is proportional to the sum of logs of merge widths—i.e., the log of the product of the merge widths, as follows:

comparisons in 2 merge passes=$(N*\log \text{merge\_width\_pass\_1})+(N*\log \text{merge\_width\_pass\_2})=N*\log(\text{merge\_width\_pass\_1}*\text{merg\_width\_pass\_2})$ To calculate this, in one implementation, the following algorithm is used:

```
R = number_of_runs;
time_factor = 1;
while (R>1) // each iteration is a merge pass
{
    // Determine the optimal merge width for pass K
    // using the logic in sqlsGetMergeHeap
    // (which in the simulation requests memory
    // to the virtual memory broker)
    // The result is also affected by the use of
    // prefetching.
    time_factor *= merge_width_pass_K;
    // Recompute number of runs resulting from
    // this pass K that will need to be processed in
    // pass K+1
    R = ceil( R / merge_width_pass_K);
}
```

The time to merge will be

O(log time_factor)

A summary of the discussion above with corresponding equations will now be provided through Tables 2-3, in which N is the size of the sort, R is the number of runs generated by the buffer sort phase, and time_factor is the product of the merge widths for all the merge passes.

Summary for CPU time Cost Functions

TABLE 2

BIN SORT
(all sorts considered)

| 1 run | buffer sort phase | (N * log (N)) |
|---|---|---|
| R runs (R > 1) | buffer sort phase | (N * (log N − log R)) |
| R runs (R > 1) | tournament merge phase | (N * (log time_factor)) |

| | | |
|---|---|---|
| TREE SORT (size limited sorts (e.g., truncated sorts), or sorts that have not fetched all the N rows (M is the number of rows fetched)) | | |
| 1 run | buffer sort phase | (N * log (M)) |
| R runs (R > 1) | buffer sort phase | (N * (log N – log R)) |
| R runs (R > 1) | tournament merge phase last pass | (M * (log( merge_width_last_pass)) |
| R runs (R > 1) | tournament merge phase last pass | (N * (log(time_factor / merge_width_last_pass)) |

Example for CPU Time

1) BINSORT, all rows fetched, simulated has more memory than real.

Real        spills 2 runs
Simulation  avoids the spill
Difference in cost for the buffer sort phase =
[(( measured cost of binsort function calls)
) * (N log N)] divided by ( N log N - N log 2).
Difference in cost for the tournament merge phase =
-1 * (measured cost of merge
function calls)

2) BINSORT, 10% of rows fetched, real has more memory than simulated.

Real        avoids the spill
Simulation  spills 2 runs
Difference in cost for the buffer sort phase =
[((measured cost of binsort function call)
) * (N log N - N log 2)] divided by(N log N).
Difference in cost for the tournament merge phase =
(historical cost of merge funct calls
per byte) * ((bytes of 10% of rows) * (log time_factor_simulated))

3) BINSORT, 10% of rows fetched, simulated has more memory than real.

Real        spills 3 runs
Simulation  spills 200 runs
Difference in cost for the buffer sort phase =
[((measured cost of binsort function call)
) * (N log N - N log 200)] divided by(N log N - N log 3).
Difference in cost for the tournament merge phase =
[((measured cost of merge function
calls for 20% of rows) ) * ( N log time_factor_simulated )]
divided by ( N log
time_factor_real).

4) TREESORT, size limited sort fetching M rows, real has more memory than simulated.

Real        avoids the spill
Simulation  spills 10 runs
Difference in cost for the buffer sort phase =
[((measured cost of treesort comparison
function calls)) * (N log N - N log 10)] divided by (N log M)
Difference in cost for the tournament merge phase =
(historical cost of merge function
calls per byte) * ((bytes of M rows fetched) * (log 10))

5) TREESORT, size limited sort fetching M rows, simulated has more memory than real.

Real        spills 10 runs
Simulation  avoids the spill
Difference in cost for the buffer sort phase =
[((measured cost of treesort comparison
function calls)) * (N log M)] divided by N (log N - log 10).
Difference in cost for the tournament merge phase =
-1* (measured cost of merge
function calls)

I/O Time

Time Spent Writing to External Storage (Spilling/Writing Intermediate Merge Runs)

In one implementation, whenever a sort spills to a sort buffer (e.g., writes data to an external storage), the sort actually places data in a temporary (temp) table (in the buffer pool), not knowing whether or not the data will actually get paged out of memory, and whether such action is going to occur synchronously or asynchronously. In one implementation, a sort will be spilled to temp table in the following two situations: if a sort spills any amount of data to temp tables then all of the data (entire contents of all rows) is spilled to a temp table, if a sort requires a merge pass all of the data is written to a temp table, and if a sort is non-piped, data is always spilled to a temp table.

To be able to predict the time this operation (I/O time) will take in the virtual sort (in one implementation) a time stamp of both of these events are taken in the real sort, and then the number of times the write operation will take place for a virtual sort of the same size and with a different amount of memory will be calculated. So, if a given sort *actually* spills then with high accuracy, it can be determined how long it would take to perform one more merge pass, or one less merge pass, or no spilling at all. If no spilling occurs, the time of a write operation is not available for the current sort. If it is desired to predict how long it would take in a simulated configuration were the sort is actually required to spill, a reference value is required for the time to perform a write operation. For this situation, the following is implemented: the average read time and write time per byte each time a sort or hash join spills is saved in a repository, and a historical average is computed (avgReadTime/avgWriteTime) is computed from the repository of saved values, and this historical average is used as a reference value. If no writing has taken place in the system, the maximum transfer rate time for the temporary tablespaces can be used. This maximum transfer rate can be set at database startup.

Time Spent Reading from Temp Tables/Disk (During Merge Passes and Fetches)

This time is similar to writing to temp tables, however the sort component also takes advantage of the I/O pre-fetching, which could change the number of runs processed per merge pass in the merge phase. The assumption in the simulation of sort is that the same pre-fetching that takes place in the real sort will also take place in the simulated sort, for which the timing of the read operations is considered in the same way as the timing of the write operations When the pre-fetching is enabled in the buffer pool associated to a temporary table space, the space available for pre-fetching limits the number of runs that will be processed per merge pass, which could increase the number of merge passes that will be done. The number of merge passes will not be limited by prefetching only when the following condition is met:

$$merg\_width*2 > tempbuffer\ poolSize*80\%/4$$

That is, in one implementation, the sort considers it a priority to have a minimum of (2) pages for pre-fetching in the buffer pool associated with a temporary table space per run if pre-fetching is enabled, and will reduce the merge width (and increase the number of merge passes) to satisfy the condition above, regardless of the amount of memory available for merging.

Determining Cost/Benefit of a Hash Join in a Database System

In a database system, the final size of the input tables of a hash join are only known with complete certainty after the hash join is executed. The reason for this is that it is very hard to predetermine the size of the data to be joined because in general this data is the product of other subqueries, and the size of the input for those subqueries is also hard to predict. It is also generally hard to predict the size of the input if the data is coming straight from disk because the continuous updates to the tables make it very hard to maintain the statistics up to date. The same argument can be made for the prediction of the I/O time involved in the execution of the hash join. The I/O time depends on the amount of data to be joined, the characteristics of this data, the characteristics of the CPU in which the operation is executed, and the characteristics of the storage system in which the data is written to and read from.

For these reasons, in one implementation, the actual CPU cost and I/O cost is used—i.e., the CPU cost and I/O cost measured during the execution of the hash join. This method also uses complete information about the characteristics of the hash join, like for example the size of its input tables, because the size of its input tables can also be measured during the execution of the hash join. Accordingly, in one implementation, the computation of the estimated cost will be based on this complete information.

In one implementation, the only variable is the amount of memory granted to the hash join. The cost predictor will assume that the hash join has been granted a different amount of memory that the amount granted to the real measured hash join. This will allow for the computation of the difference in cost between the real measured hash join and the simulated hash join, and will also permit the computation of the difference in the amounts of memory granted to the real measured hash join and the simulated hash join. These two differences can be used to compute the marginal cost/benefit (e.g., in seconds per page of memory) of giving the hash join more or less memory. This marginal cost/benefit for hash join can be compared with that of other memory consumers to decide whether to give more memory to hash joins or take memory from hash joins. Any suitable method for calculating the marginal cost/benefit and tuning memory allocation for all memory consumers can be used.

Figure 5:
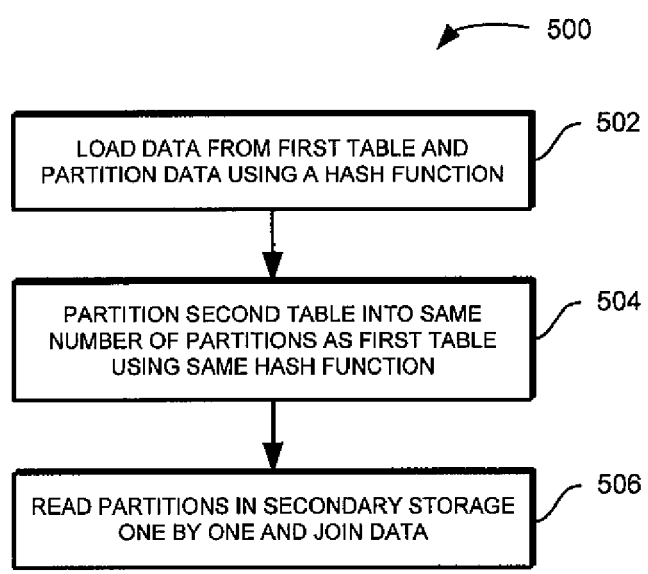
FIG. 5 illustrates a method for executing a hash join operation in accordance with one implementation of the invention.

In one implementation, it is assumed herein that a hash join is executed in three phases as illustrated by method 500 of FIG. 5. Accordingly, in this implementation, in the first phase the data from the first table is loaded and partitioned using a hash function (step 502). Some partitions will be kept in main memory and other partitions will be written to secondary storage. In the second phase, the second table is also partitioned into the same number of partitions using the same hash function (step 504). If the partition from the first table is in main memory the data from both tables is joined and the matching pairs are returned. If the partition from the first table is in secondary storage, the partition from the second table is also written down to the same secondary storage. In the third phase the partitions that are in secondary storage are read one by one and the data in them is joined (step 506). If the third phase does not have enough memory to hold a complete partition, multiple passes will be done, which imply that the probe is read from secondary storage multiple times. For this third phase (in one implementation) the roles of the probe and build partitions can be reversed, making the probe the partition that is read into memory one time and making the build the partition that is read multiple times.

The basic assumption is that the performance of a hash join is deterministic. Given the amount of memory that a hash join can use during the first phase and the characteristics of the hash join, it can be predicted the number of partitions that will be written to secondary storage (if any). Given the number of partitions written to secondary storage by the first phase, the amount of data from the second table to be written to secondary storage can be predicted. Note that this prediction may not be 100% accurate due to data skew. Given the amount of memory to use in the third phase, it can be predicted the number of times the data will be read from secondary storage.

Provided below is a method to simulate the number of basic I/O operations performed by the system to join the data in each of the three phases for any amount of memory. It is assumed herein that the actual performance of the basic operations in the real execution of the hash join can be measured and that the amount of memory used in the real system and the amount of memory used in what we call the virtual system are known. Accordingly, by multiplying the predicted number of basic operations by the average time each of these basic operations took in the real system, the cost of the virtual system can be predicted.

The performance of a hash join generally depends on various variables. One of the most important variables is the amount of memory assigned to a hash join. Provided below is a method to measure the estimated cost of a hash join for a given amount of memory. One novelty of this approach is that, in one implementation, the cost estimation is based on the measurement of the cost to execute the same hash join under a different amount of memory and on the complete information of the characteristics of the hash join (like for example the size of its input tables).

Introduction to the Hash Join Algorithm Implementation

From a high level, (in one implementation) the hash join algorithm's goal is to split the relations into "partitions" using a generic hash function, and to process the matching rows in each partition independently from those in other partitions. In one implementation, a hash join has three phases: build, probe and leftovers. In the build phase, the build tuples are hashed to a partition and saved in memory, or spilled to temp table if there is not enough room. The result of the build phase is that each partition is either completely in memory or completely on disk. In the probe phase, each probe tuple is hashed to the corresponding partition, and matched with build tuples if the partition is in memory, or spilled, if not. Finally, in the leftovers phase, each partition that was spilled is processed independently to determine the matched rows.

The performance of a hash join is highly related to the amount of memory that is given to the hash join. Increased memory means reduced I/O. The initial sizing of the memory required is done based on the size of the smaller of the two relations to be joined, called the build table, but hash join is intelligent and flexible enough to use additional memory if the initial sizing was wrong. However, the initial determination of the number of partitions to use, which is also important for the performance, is determined based on the optimizer's estimated size and the initial amount of memory that the hash join was granted from the sort memory broker.

Not having enough memory for the build table tuples causes the hash join to spill some (or all) partitions in the build phase, which can have serious performance implications. The worst situation happens when one or more of these spilled partitions does not fit in memory during the leftovers phase. This then leads to hash loops, which have quadratic complexity. Hash join is intelligent enough to switch build and probe in leftovers (role reversal) if the probe blocks in the partition are less than the build blocks (which could be due to a wrong optimizer's estimated size, skewed data, or the use of bit filters). The optimizer tries to avoid using a hash join if it could end up doing hash loops, but the optimizer makes this decision on the assumption that the hash function is perfect, and relying on the estimated size of both relations, thus in one implementation, hash loops cannot be avoided.

In one implementation, bit filters are used to improve the efficiency of the hash join. These bit filters can be set up during the build phase, and used to reject probe tuples from partitions that were spilled without having to actually check whether there are matches in the partition or not. This is very good for the performance, especially for those partitions that were spilled, because only those tuples from the probe table not rejected by the bit filters are spilled for leftovers processing, considerably reducing the size written to temp table. In one implementation, the optimizer suggests use of bit filters and determines sizes of the bit filters, but hash join could decide not to use bit filters if there is not enough memory, for example, if the sort memory broker granted less memory than what was requested due to the use of throttling due to a high degree of concurrent use of memory.

Model for Predicting the Performance of a Hash Join

The main component that affects the performance of the hash join is the amount of I/O that it needs to perform, which can happen at different stages of the hash join. In summary, the simulation of a hash join needs to account for the following elements (in one implementation) to determine the cost/benefit of changing the amount of memory granted to it. In the build phase, a partition may be evicted, which results in the writing of all of its tuple blocks to temp table. Hash join also applies to an algorithm to swap in and out partitions based on the "optimal" layout that result from the packing algorithm. In the probe phase, the algorithm writes to disk all probe tuples from those partitions that are on disk. The use of bit filters could reduce the amount of writing. In the leftovers phase, each partition that is on disk needs to be processed, by first bringing its build portion into memory, and then reading the probe portion of it. It could also require multiple readings of the whole probe portion of the partition if hash loops are required due to memory constraints. Next a discussion of the main steps of the simulation to determine the amount of I/O in each phase will be provided.

Simulating the Initialization Phase of the Hash Join

In one implementation, the initialization phase is where the real hash join first interacts with the memory broker to determine the amount of memory available to the real hash join. The simulation of this phase follows the same logic to retrieve the memory from the simulated memory broker. Once the memory has been granted, (in one implementation) the simulation of the initialization algorithm determines whether or not the simulated hash join will use bit filters, size of the hash table, number of partitions, number of tuple blocks to use, and the maximum number of tuple blocks to use.

Simulating the Build Phase

In one implementation, once the build phase has finished, the hash join monitor collects the information of the sizes of the real partitions. The first step before the build phase could be simulated is to redistribute the data into the partition layout of each of the simulations of the hash join.

Redistributing Data to Partition Layout in Simulated Hash Join

The number of partitions can affect the amount of I/O the hash join performs. Using a large number of partitions makes the partitioning of the data more granular, making its cost function less step-wise and giving better performance if only a portion of the hash join is spilled (because the more granular the partitioning, the smaller the number of partitions spilled). For this reasons, simulating the correct number of partitions adds to the accuracy of the model.

Since the number of partitions can be different in the real hash join and simulated hash join because the amount of memory can also be different, in one implementation the tuples are redistributed from the real partition layout to the new simulated partition layout. In one implementation, two simple redistribute algorithms provided below are used to approximate the distribution of the data in the new simulated partition layout:

The following definitions are used below. NR is the number of partitions in the real hash join, NS is the number of partitions in the simulated hash join, a mapped partition is a partition ID that exists both in the real hash join and the simulated hash join, and an unmapped partition is a partition that does not exist in one of the two.

1) NS<NR: There are (NR-NS) unmapped partitions in the real hash join. The tuples are uniformly redistributed from the unmapped partitions of the real hash join to the mapped partitions in the simulated hash join.
2) NS>NR: There are (NS-NR) unmapped partitions in the simulated hash join. From each real partition a percentage of the tuples equal to (1−NR/NS) is uniformly redistributed to the unmapped partitions in the simulated hash join.

In one implementation, the redistributing algorithm above is used to redistribute the build tuples before simulating the build phase and for the probe tuples before simulating the probe phase.

Packing and Preparing for the Probe Phase

The goal of the simulation of the build phase is to determine the number of partitions that fit in memory for the probe phase, and to determine the I/O cost of the build phase and packing algorithm. To do this, (in one implementation) a first fit algorithm to prepare the input for the packing algorithm is used. If the simulated hash join could be using more memory than that granted in the simulation of init due to a change in the value of SORTHEAP or due to a wrong estimated size, the simulation will try to reserve this additional memory from the simulation of the sort memory broker. Finally, pack partitions are simulated, and the status is set to in-memory or spilled for the status for each partition is set to in-memory or spilled. Throughout the simulation the number of "simulated I/O's" is recorded and it will be used to determine the final I/O cost of the simulated hash join.

Simulating the Probe Phase

In one implementation, the probe phase simulation consists of determining the number of probe bytes written for those build partitions that were on disk in the simulated hash join. To do this, the size of each probe partition in the simulated hash join is determined. The difference with the build phase is that the number of probe tuples (and bytes) in each partition of the real hash join was measured using three counters: number of tuples whose size is known because they were formatted (to be spilled), number of tuples whose size is unknown (because they were returned directly without formatting, and passed the bit filters), and finally the number of tuples rejected by bit filters. The sum of the three counters is the real size of the probe partitions, which will also be the size of the partition if bit filters were not used in the simulated hash join. However, since the use of bit filters could change depending on the memory available, in each case the following is defined.

1) The bit filters are enabled in both the real and the simulated hash join: the counted rejected tuples will not be included in the size of the partition in the simulated hash join.
2) The bit filters are enabled in the real hash join but disabled in the simulated hash join: the tuples rejected by the bit filters will be included in the size of a virtual partition.
3) The bit filters are disabled in the real hash join but enabled in the simulated hash join: an estimate of the rejection ratio is needed to determine the percentage of the tuples that could have been rejected by the bit filters. In one implementation, the same model that the query optimizer uses is implemented. The rejection ratio is (1−false_positives_ratio), which is defined as:

$$\text{false\_positives\_ratio} = (1-(1-k/n)^d)^k = (1-(1-2/\text{BitFilterSize})^{\text{BuildTableSize}})^2$$

where n = # of bits in the bit filter size, this is an input to the real hash join algorithm, d = distinct values being hashed, in our case, this is the size of the build table, and k = is the number of bit filters, each of length k/n, which in our case is always 2.

In one implementation, this rejection ratio will be used to determine the portion of the probe tuples in each partition that are rejected and not written to disk.

Once the sizes of the real partitions is determined, (in one implementation) the probe tuples are redistributed among the virtual partition layout as described above to determine the size of the partitions in the simulated hash join. From this, determining the number of I/O operations is straightforward.

Simulating the Leftovers Phase

In one implementation, for each partition that was spilled the final processing of the partition is simulated. This includes the simulation of role reversal and hash loops (if applicable) to count the final number of I/O's in each simulated hash join.

Method to Compute the Marginal Cost/Benefit

A method to compute the marginal cost/benefit that will result from changing the total amount of memory given to query operators (e.g., sort and hash join) will now be described. In one implementation, the total amount of memory is defined by the SHEAPTHRES configuration parameter, as defined in the DB2 database system, available from International Business Machines Corporation, of Armonk, N.Y. In particular, a method is provided below for producing a quantitative value for the marginal benefit of increasing SHEAPTHRES, and the marginal cost of decreasing SHEAPTHRES. In one implementation, this marginal cost/benefit metric is generated by the SHEAPTHRES simulation, and is reported to the memory tuner when requested.

The memory tuner then uses this information to determine the adjustments to the SHEAPTHRES configuration parameter, therefore, closing the loop. Each of the iterations of this closed loop will be referred to as a "time window", and a length of the time window (in one implementation) is variable and decided by the memory tuner. In one implementation, the marginal cost/benefit reported by the SHEAPTHRES simulation only reflects the activity that occurred during the time window.

Figure 6:
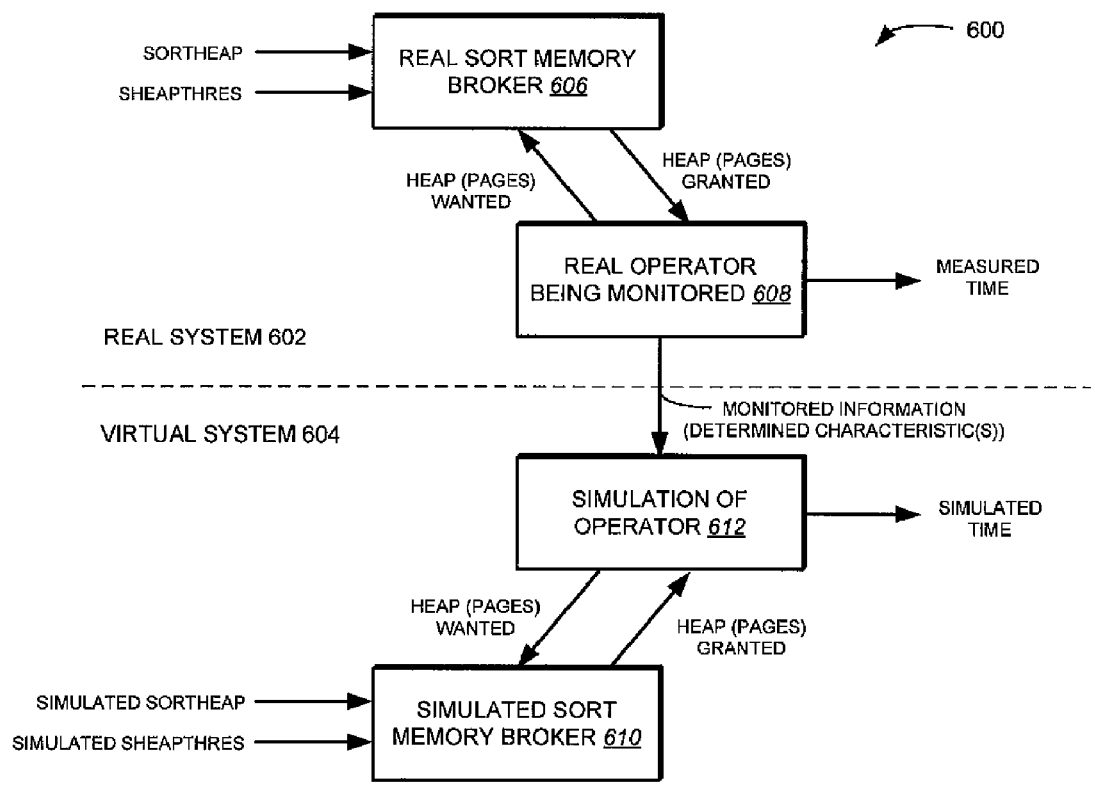
FIG. 6 is a block diagram of a data processing system including a real system and a virtual system in accordance with one implementation of the invention.

In one implementation, the marginal cost/benefit for SHEAPTHRES is determined by simulating the behavior of the operators that are running in a real system assuming that they are running in a simulated (virtual) system in which the memory configuration values are different to those in the real system. FIG. 6 illustrated a data processing system 600 including a real system 602 and a virtual system 604 in accordance with one implementation. Real system 602 includes a real sort memory broker 606 and a real operator being monitored 608. Virtual system 604 includes a simulated sort memory broker 610 and a simulation of operator 612. The operation of each of the components of data processing system 600 is described in greater detail below.

In one implementation, the simulation of each operator (e.g., simulation of operator 612) will interact with the simulated system to determine the amount of memory available to it using the same protocol that the operator uses in the real system (e.g., real operator being monitored 608) to ask for memory. The simulation of an operator uses the measurements done to the operator running in the real system to calculate an estimated cost in time for the operator to run in the simulated system. This estimated time is then compared with the real measured time of the operator running in the real system to produce the difference in time. The marginal cost/benefit is computed by adding up all the differences for all the operators that occurred in the time window, and dividing this value by the difference between the real value of SHEAPTHRES and the simulated value of SHEAPTHRES. Any suitable cost model used to estimate the cost of each operator (for example, sort and hash join) based on the amount of memory assigned to it and the measurements to the real operator can be used.

Particular advantages of methods described herein are that (in some implementation) such methods will be continually sensing the workload and the needs for operator memory. Accordingly, in these implementations, a memory tuner (not shown) can continuously adjust memory at regular intervals to changes in needs for the type of memory in the database engine. The advantage of using a cost based approach is that this metric can be easily compared with other cost based metrics computed for consumers with total different nature. Another advantage is that this method mimics the behavior of the real system under the alternative configurations, sharing the logic that the real system uses, but assuming that the memory configuration is different. This means that changes in the logic in the real system will be automatically acquired by the simulation, maintaining the simulation up-to-date with the real system evolution.

In one implementation, the configuration parameter SHEAPTHRES is the limit for the total amount of memory that all the query operators put together can use at any point in time. There is another configuration parameter named SORTHEAP that (in one implementation) limits the amount that each of these operators could use from this total amount for all the operators. For simplicity, the ratio between the maximum for all operators and the maximum for one operator is assumed to be maintained at a constant value (SHEAPTHRES/SORTHEAP=constant). However, this invention is not limited to the case when the SORTHEAP configuration parameter value does not change, in one implementation, changes in both SORTHEAP and SHEAPTHRES are supported.

Figure 7:
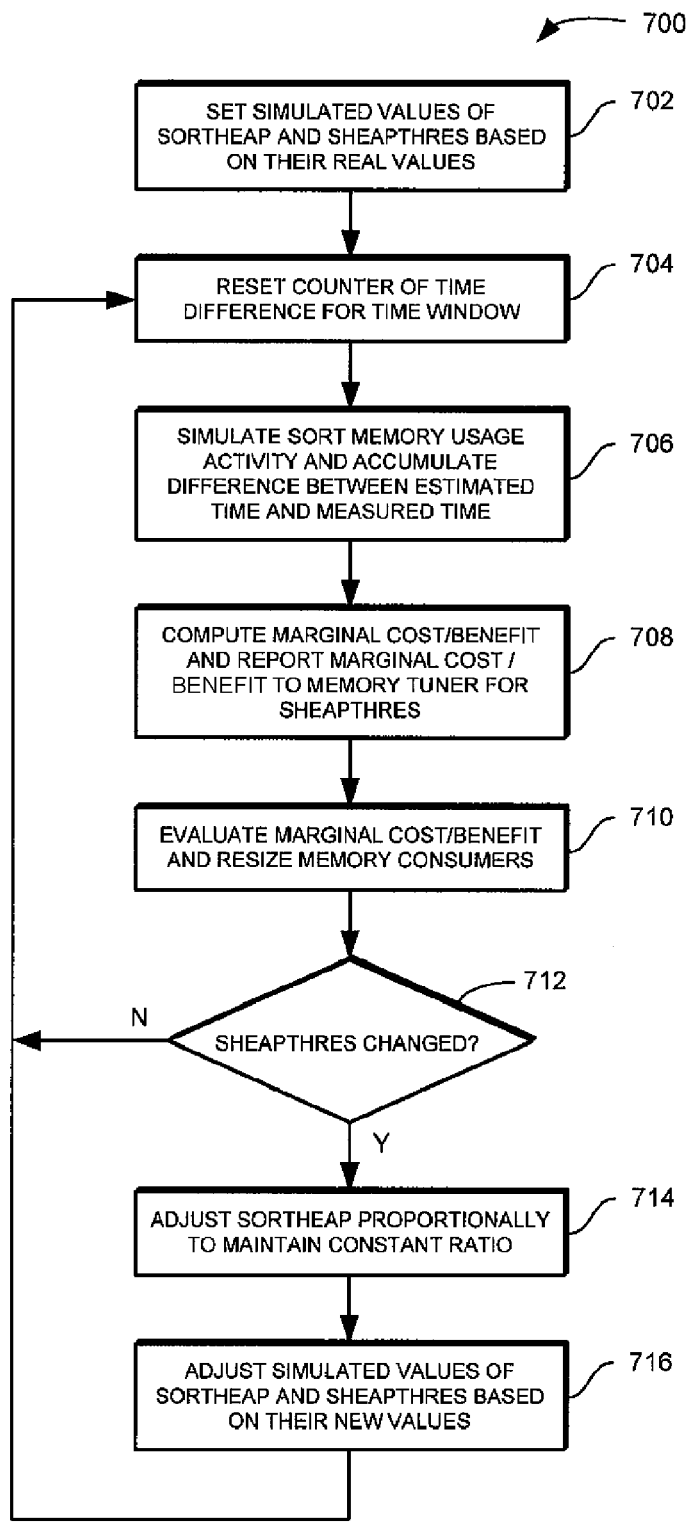
FIG. 7 illustrates a method for adjusting simulated values in a data processing system in accordance with one implementation of the invention.

As mentioned above, a method to compute the marginal cost/benefit is provided through a simulation system that simulates a real system, but using a different amount of memory. For example, if the real value of SHEAPTHRES is 1000 pages, then the simulation could use a simulated SHEAPTHRES value of 800 pages, or 1200 pages. The difference in cost divided by the difference in pages will result in the marginal cost/benefit that is the product of the simulation. This method also allows for simulation of multiple values of SHEAPTHRES in independent simulations that will allow the memory tuner to have a better understanding of the effects of changing the total amount of memory assigned to the query operators. For simplicity it is assumed herein that only one value is being simulated. However, multiple values can be simulated using techniques described herein. FIG. 7 shows a method 700 for adjusting simulated values in the data processing system in accordance with one implementation of the invention. Simulated values of SORTHEAP and SHEAPTHRES are set based on their real values (step 702). Accordingly, in one implementation, the setting of the simulation ratio between the real system and the simulated system is the first step of the algorithm. Since, in one implementation, the SHEAPTHRES/SORTHEAP ratio is constant the simulated value for SORTHEAP will also respect this same constant ratio to the simulated value of SHEAPTHRES.

In one implementation, the amount of memory available to an operator not only depends on the values of these two configuration parameters (SORTHEAP and SHEAPTHRES) but also on the concurrent use of the memory. If the amount of memory used by all active operators is close to or passes the value of SHEAPTHRES, a mechanism of throttling is activated, and new requests will be granted less and less memory. This throttling mechanism is controlled by the sort memory broker module. For this reason, the simulation of the system in which the operators run needs a mechanism to determine this amount of memory available that is used as input for the simulation of each of these operators.

A counter of time difference for the time window is reset (step 704). The sort memory usage activity is simulated and the difference between the estimated time and the measured time is accumulated (step 706). As discussed above, based on this amount of memory available to the operator in a particular simulated system, the simulation of an operator determines the cost in terms of I/O and CPU time to perform the operation. In one implementation, the simulation uses the actual cost of the runtime operator as a basis to estimate the cost in time for the simulated operator. This estimated time is then compared with the real measured time of the operator running in the real system to produce the difference in time. In one implementation, this difference in time is then added to a global counter that includes the differences in time for all the operators.

A marginal cost/benefit is computed and is reported to a memory tuner (step 708). In one implementation, the marginal cost/benefit is computed by dividing the differences in time for all the operators that occurred in the time window by the difference between the real value of SHEAPTHRES and the simulated value of SHEAPTHRES. The marginal cost benefit is then:

$$marginalCostBenefit = \frac{\sum_{\substack{i= \\ \text{all operators} \\ \text{in time window}}} (measuredTime_i - estimatedTime_i)}{realSHEAPTHRES - simulatedSHEAPTHRES}$$

Ultimately, when the memory tuner requires the marginal cost/benefit for the time window to be reported, the marginal cost/benefit is computed and output to the memory tuner to indicate how the system would react if the simulated SHEAPTHRES were used. Then the memory tuner will evaluate all the marginal cost/benefits reported by all memory consumers and will decide what the new sizes for each of the memory consumers should be, including SHEAPTHRES (step 710). A determination is made whether the value of SHEAPTHRES has changed (step 712). If the value for SHEAPTHRES has not changed then method 700 returns to step 704. Otherwise, if the SHEAPTHRES value has been changed, the value of the SORTHEAP configuration parameter has to be adjusted (step 714). Once this is done the values of the simulated configuration parameters (e.g., SORTHEAP and SHEAPTHRES) have to be adjusted (step 716), and method 700 starts again to collect the information for a new time window.

Simulating Concurrent Operator Interactions

In the actual (real) system, concurrent operators interact through the use of the sort memory broker (e.g., real sort memory broker 606), which determines the amount of memory that the concurrent operators are allowed to use. In one implementation, concurrency is simulated by simulating this sort memory broker (through simulated sort memory broker 612), but using simulated values of SORTHEAP and SHEAPTHRES and maintaining a memory reservation counter in this "simulated" environment. Since (in one implementation) each simulated operator is "run" in parallel to and as part of the real operator, the simulated operators will request and release memory at the same time as the real operator. In addition to this, for the simulation to be accurate, in one implementation, the simulated operators use the same memory request protocol as the real operator. When a simulated operator requires memory, the simulated operator calls the simulation of the query sort memory broker. Similarly when a simulated operator frees up memory the simulated operator notifies the simulation of the sort memory broker. The simulation of the sort memory broker maintains the counter that determines the total memory usage when using the simulated configuration. The simulation of the sort memory broker then implements the same logic that the real sort memory broker uses to decide the amount of memory to be granted to each request.

Simulating an Operator

In one implementation, the memory for the query operators is used by several query operators, like sort, hash join, index anding, merge join, in-memory table, and so on. These query operators are very similar in nature, in the sense that they all have a variable amount of data as input, and that they all need an amount of memory proportional to the amount of data to be processed to be able to produce the result. Also, if not all the memory needed is assigned to the query operator, the operator will run in a restricted memory use mode, and will take longer to produce the result (in most cases more memory means better performance). In one implementation, this invention assumes the existence of a method to compute the cost in time for an operator given the amount of memory assigned to the operator. It is also assumed that the most accurate cost in time for an operator can be estimated when the operator has completed, and that while an operator is running, a less accurate estimate of the cost can be determined based on partial information on the amount of data to be processed, amongst other input values.

In one implementation, each time a real operator executes a function call that needs to interact with the real sort memory broker, the simulation has to perform the same action but, instead, interacts with the simulated memory broker. For example, when a new sort is created, the sort needs to reserve memory (e.g., heap (pages) wanted). In one implementation, the amount of memory the new sort receives (e.g., heap (pages) granted) is the result of an algorithm that uses as input the current value of SORTHEAP and SHEAPTHRES, the total reservation level, the estimated size of the sort, and some other characteristics of the sort. The simulated operator will similarly request memory from the simulation of the sort memory broker, and the simulated operator will be granted an amount based on the simulated values of the configuration parameters SORTHEAP and SHEAPTHRES and the current total reservation level in this simulated environment.

The amount of memory the operator is granted may determine its performance. In one implementation, if the real operator is not granted enough memory and needs to write some data to disk, but the simulation of the operator is granted enough memory to avoid this writing of data to disk, then there will be a time savings reported. Similarly, an extra cost will be incurred in the reciprocal case.

Long Running Operators

To successfully tune the SHEAPTHRES configuration parameter, the marginal cost/benefit for the time windows needs to be reported with high accuracy, which implies taking into account all activity that occurred during a time window. An operator that is fully contained in a single time window can have all of its estimated cost difference added to counters associated with the current time window and all of this information can be used to compute the marginal cost/benefit for the sane time window (which does not produce any inaccuracies). However, when the time windows are short relative to the run-time required by an operator (e.g., the operators that consume sort memory may span several time windows), it is not clear how the operator's benefit (or estimated cost) has to be taken into account. Alternatives are to simply add an estimated cost (associated with the long running operator) to the counters of all time windows that overlap with execution of the long running operator, to add an estimated cost (associated with the long running operator) to just one of the time windows, or to split an estimated cost (associated with the long running operator) amongst all the time windows that overlap with execution of the long running operator. A method to split an estimated cost (associated with the long running operator) amongst all the time windows that overlap with execution of the long running operator is provided below.

Two concerns mainly need to be addressed to report part of the estimated cost in each time window that overlaps with the execution of the operator (also referred to as operation below). First, the estimated total cost of the operation needs to be normalized so that only estimated cost attributed to the current time window is reported. Secondly, if the operation is not complete at the time of an interval report, then the model will not yet have determined the estimated cost for the operation because it is based on complete information about the operator's execution. Accordingly, some approximation of the estimated total cost for the portion of the operation that occurred in the current time window needs to be reported. This is especially problematic because the benefit reporting model accuracy is based on the assumption that the real size of the operator is known, and that the real cost in time the operator took is also known, both of which are not known if execution of the operator has not finished. In one implementation, to deal with this, a simplified cost model is implemented that can report the benefit based on partial information. Using this simplified model, the cost/benefit can be reported incrementally over the history of the operator rather than being only reporting once when the operator completes execution.

Normalizing the Benefit for Long Running Operators

Figure 8:
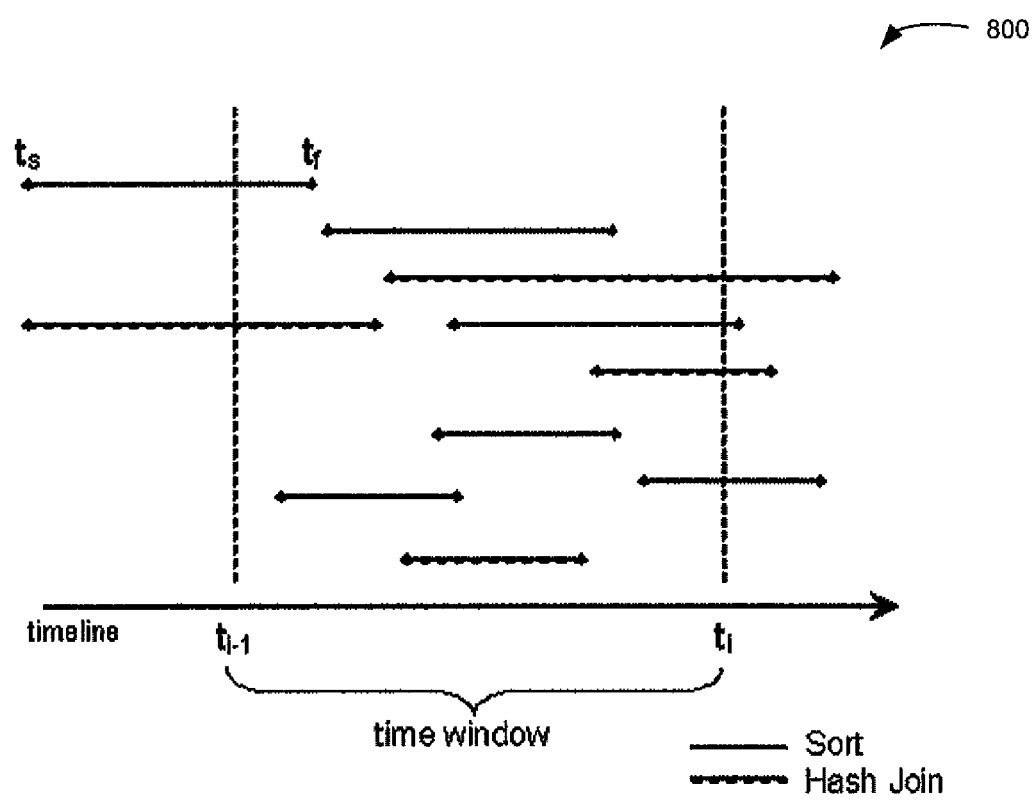
FIG. 8 shows a diagram of a timeline of operations.

In one implementation, the estimated cost of each operator is normalized against the percentage of the operator that completed during the current time window. For example, assuming that a particular hash join shows an estimated benefit of 10 ms from increasing the configuration parameters values by 10%. If the hash join was contained within a single time window, or within a time interval currently being reported to the simulation, the estimated cost of 10 ms can be reported. However, if only a fraction of the hash join was contained within the interval then the benefit is normalized so that only the corresponding fraction of the benefit is reported in the interval. Accordingly, there are two cases in which the benefit is normalized: 1) the operation has completed (but started in a previous interval); and 2) the operation has not yet completed (started either in the current interval or in a previous interval). FIG. 8 shows a diagram 800 of a timeline of operations, some of which intersect the time interval boundary of the time window $(t_{i-1}-t_i)$.

When normalizing the benefit, (in one implementation) a determination is first of how much of the operation has been completed. Case number 1 above (i.e., the operation has completed) is trivial. The cost predictor knows how long the current interval is and also knows how long the operator took (e.g., the cost predictor keeps track of the start time and end time of each sort and hash join), so the cost predictor multiplies the benefit by the percentage of the operation elapsed time that completed in the current time interval as follows:

$$\text{operatorNormalizedBenefit}=\text{operatorFinalBenefit}*(t_f-t_{i-1})/(t_f-t_s)$$

Case number 2 is more difficult and (in one implementation) is solved approximately. In this case, the operation has not yet finished and it may not be known how much longer the operation will take. In one implementation, the cost predictor uses the optimizer estimated size combined with the size that has been actually monitored to estimate how much longer the operation will take and how much progress has been completed at the time of reporting. In one implementation, the approximation of the percentage of the operation that has been completed is done differently for sort and hash join. Then the normalization of the benefit to account for the benefit that happened in the current interval is as follows if the operator started in a current time window:

$$\text{operatorNormalizedBenefit}=\text{operatorPartialBenefit}*\text{Percentage Complete}$$

and if the operator started in the previous time window the following equation is implemented:

$$\text{operatorNormalizedBenefit}=\text{operatorpartialBenefit}*\text{Percentage Complete}*[(t_f-t_{i-1})/(t_f-t_s)]$$

Reporting Partial Benefit

For those operations that have not completed at the time of a benefit report (in one implementation) the cost predictor employ a separate more approximate cost estimation model, referred as a partial cost estimation model. The difference between the partial cost estimation model and the complete cost estimation model is that in the partial cost estimation model the cost function has to make additional assumptions about the operators that are running to be able to produce the estimated cost of the operation in the simulated environment. In particular, the estimated total cost produced with the partial cost estimation model is scaled according to a percentage corresponding to how much of the operator has been completed to produce a partial estimated cost reported. The partial estimated cost is, in turn, used to produce the marginal cost/benefit that is reported to the memory tuner.

One or more of method steps described above can be performed by one or more programmable processors executing a computer program to perform functions by operating on input data and generating output. Generally, the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, or transport the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Figure 9:
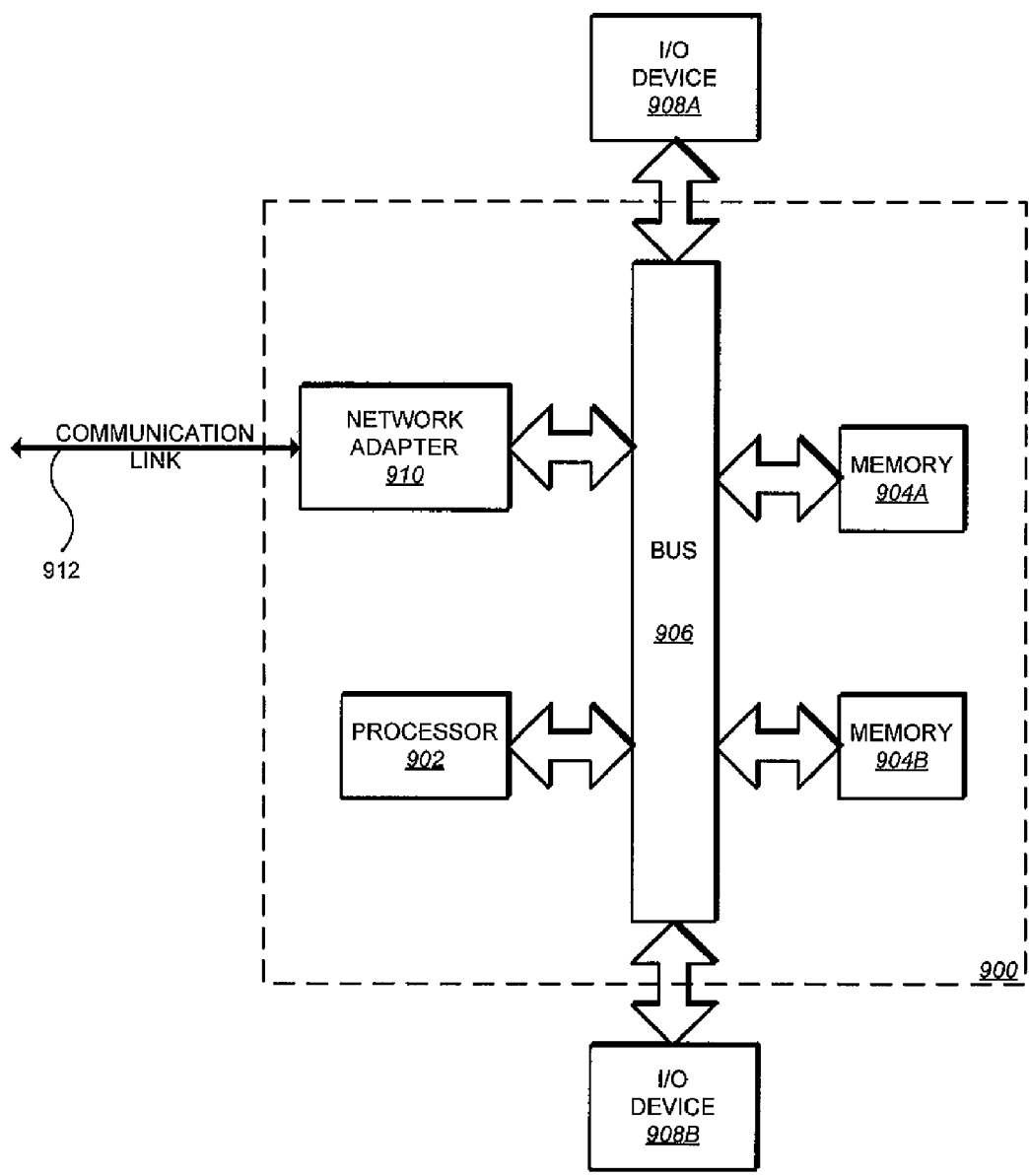
FIG. 9 is a block diagram of a data processing system suitable for storing and/or executing program code in accordance with one implementation of the invention.

FIG. 9 illustrates a data processing system 900 suitable for storing and/or executing program code. Data processing system 900 includes a processor 902 coupled to memory elements 904A-B through a system bus 906. In other embodiments, data processing system 900 may include more than one processor and each processor may be coupled directly or indirectly to one or more memory elements through a system bus.

Memory elements 904A-B can include local memory employed during actual execution of the program code, bulk storage, and cache memories that provide temporary storage of at least some program code in order to reduce the number of times the code must be retrieved from bulk storage during execution. As shown, input/output or I/O devices 908A-B (including, but not limited to, keyboards, displays, pointing devices, etc.) are coupled to data processing system 900. I/O devices 908A-B may be coupled to data processing system 900 directly or indirectly through intervening I/O controllers (not shown).

In the embodiment, a network adapter 910 is coupled to data processing system 900 to enable data processing system 900 to become coupled to other data processing systems or remote printers or storage devices through communication link 912. Communication link 912 can be a private or public network. Modems, cable modems, and Ethernet cards are just a few of the currently available types of network adapters.

Various implementations for managing digital content in an enterprise content management system have been described. Nevertheless, one or ordinary skill in the art will readily recognize that there that various modifications may be made to the implementations, and any variation would be within the scope of the present invention. For example, the steps of methods discussed above can be performed in a different order to achieve desirable results. Accordingly, many modifications may be made by one of ordinary skill in the art without departing from the scope of the following claims.

What is claimed is:

1. A method for simulating an operation, the method comprising:
    executing, with a real system having a processor, an operation under a first set of conditions, wherein the first set of conditions includes a first pre-determined size of memory and includes a first number of partitions that are used in executing the operation in the real system, wherein the operation is a deterministic hash join;
    determining a characteristic associated with the execution of the operation under the first set of conditions, the characteristic being an unknown operating parameter prior to execution of the operation, wherein the characteristic is a size of input tables of the hash join; and
    executing, with a virtual system, a simulation of the operation under a second set of conditions different from the first set of conditions, wherein the simulation of the operation is constrained by the determined characteristic, and wherein the second set of conditions includes a second pre-determined size of memory that is different from the first pre-determined size of memory and includes a second number of partitions that is different from the first number of partitions that are used in executing the operation in the virtual system, and wherein redistribution of tuples occurs by:
        in response to the first number of partitions being greater than the second number of partitions, redistributing the tuples from unmapped partitions in the real system to mapped partitions in the virtual system, wherein the unmapped partitions exist in the real system and not in the virtual system, and wherein the mapped partitions exist in both the real system and the virtual system; and
        in response to the first number of partitions being smaller than the second number of partitions, redistributing a percentage of the tuples from the mapped partitions in the real system to the unmapped partitions in the virtual system.

2. The method of claim 1, further comprising:
    determining a cost/benefit of executing the operation under the second set of conditions different from the first set of conditions based at least in part on the simulation.

3. The method of claim 2, wherein the cost/benefit represents one of an amount of time saved and an amount of time lost due to executing the operation with the second set of conditions different from the first set of conditions.

4. The method of claim 1, further comprising:
    executing a sort operation with the real system and with the virtual system.

5. The method of claim 4, wherein executing the sort operation comprises executing one of a bin sort and a tree sort.

6. The method of claim 1, wherein determining the characteristic associated with the execution of the operation further comprises:
    determining one or more of a processor cost and an input/output (I/O) cost associated with the execution of the operation under the first set of conditions.

7. A computer program product, comprising a non-transitory computer-readable medium including instructions, for simulating an operation, the instructions when executed on a programmable processor causes the programmable processor to:

execute, with a real system, an operation under a first set of conditions, wherein the first set of conditions includes a first pre-determined size of memory and includes a first number of partitions that are used in executing the operation in the real system, wherein the operation is a deterministic hash join;

determine a characteristic associated with the execution of the operation under the first set of conditions, the characteristic being an unknown operating parameter prior to execution of the operation, wherein the characteristic is a size input of tables of the hash join; and execute, with a virtual system, a simulation of the operation under a second set of conditions different from the first set of conditions, wherein the simulation of the operation is constrained by the determined characteristic, and wherein the second set of conditions includes a second pre-determined size of memory that is different from the first pre-determined size of memory and includes a second number of partitions that is different from the first number of partitions that are used in executing the operation in the virtual system, and wherein redistribution of tuples occurs by:

in response to the first number of partitions being greater than the second number of partitions, redistributing the tuples from unmapped partitions in the real system to mapped partitions in the virtual system, wherein the unmapped partitions exist in the real system and not in the virtual system, and wherein the mapped partitions exist in both the real system and the virtual system; and in response to the first number of partitions being smaller than the second number of partitions, redistributing a percentage of the tuples from the mapped partitions in the real system to the unmapped partitions in the virtual system.

8. The product of claim 7, further comprising instructions to cause a programmable processor to determine a cost/benefit of executing the operation under the second set of conditions different from the first set of conditions based at least in part on the simulation.

9. The product of claim 7, wherein the cost/benefit represents one of an amount of time saved and an amount of time lost due to executing the operation with the second set of conditions different from the first set of conditions.

10. The product of claim 7, further comprising instructions to cause a programmable processor to execute a sort operation with the real system and with the virtual system.

11. The product of claim 10, wherein the instructions to execute the sort operation comprise instructions to execute one of a bin sort and a tree sort.

12. The product of claim 7, wherein the instructions to determine the characteristic associated with the execution of the operation comprise instructions to determine one or more of a processor cost and an input/output (I/O) cost associated with the execution of the operation under the first set of conditions.

13. A data processing system comprising:
a processor; and
non-transitory computer-readable medium coupled to the processor, wherein the non-transitory computer-readable medium stores program code, and wherein the program code is executed by the processor to perform:

executing, with a real system, an operation under a first set of conditions, wherein the first set of conditions includes a first pre-determined size of memory and includes a first number of partitions that are used in executing the operation in the real system, wherein the operation is a deterministic hash join;

determining a characteristic associated with the execution of the operation under the first set of conditions, the characteristic being an unknown operating parameter prior to execution of the operation, wherein the characteristic is a size of input tables of the hash join; and executing, with a virtual system, a simulation of the operation under a second set of conditions different from the first set of conditions, wherein the simulation of the operation is constrained by the determined characteristic, and wherein the second set of conditions includes a second pre-determined size of memory that is different from the first pre-determined size of memory and includes a second number of partitions that is different from the first number of partitions that are used in executing the operation in the virtual system, and wherein redistribution of tuples occurs by:

in response to the first number of partitions being greater than the second number of partitions, redistributing the tuples from unmapped partitions in the real system to mapped partitions in the virtual system, wherein the unmapped partitions exist in the real system and not in the virtual system, and wherein the mapped partitions exist in both the real system and the virtual system; and in response to the first number of partitions being smaller than the second number of partitions, redistributing a percentage of the tuples from the mapped partitions in the real system to the unmapped partitions in the virtual system.

14. The data processing system of claim 13, wherein the program code is executed by the processor to perform:
determining a cost/benefit of executing the operation under the second set of conditions different from the first set of conditions based at least in part on the simulation.

15. The data processing system of claim 14, wherein the cost/benefit represents one of an amount of time saved and an amount of time lost due to executing the operation with the second set of conditions different from the first set of conditions.

16. The data processing system of claim 13, wherein the data processing system comprises one or more of a workstation, a desktop computer, a laptop computer, a personal digital assistant (PDA), and a cell phone.

17. The data processing system of claim 13, wherein the program code is executed by the processor to perform:
executing a sort operation with the real system and with the virtual system.

18. The data processing system of claim 17, wherein executing the sort operation comprises executing one of a bin sort and a tree sort.

19. The data processing system of claim 13, wherein determining the characteristic associated with the execution of the operation comprises determining one or more of a processor cost and an input/output (I/O) cost associated with the execution of the operation under the first set of conditions.

* * * * *